United States Patent [19]

Estola et al.

[11] Patent Number: 5,327,439
[45] Date of Patent: Jul. 5, 1994

[54] EFFICIENCY OF THE VITERBI ALGORITHM

[75] Inventors: Kari P. Estola, Tampere; Harri A. Jokinen, Pertteli, both of Finland

[73] Assignee: Nokia Mobile Phones Ltd., Salo, Finland

[21] Appl. No.: 635,345

[22] Filed: Dec. 28, 1990

[30] Foreign Application Priority Data

Mar. 12, 1990 [FI] Finland .................................. 901230

[51] Int. Cl.$^5$ ...................... G06F 11/10; H03M 13/12
[52] U.S. Cl. ......................................... 371/43; 371/30; 375/96
[58] Field of Search ....................... 371/43, 30, 44, 45; 375/96, 94

[56] References Cited

U.S. PATENT DOCUMENTS

| | | |
|---|---|---|
| 4,748,626 | 5/1988 | Wong . |
| 4,757,506 | 7/1988 | Heichler . |
| 4,837,766 | 6/1989 | Yoshida .................................. 371/46 |
| 4,885,757 | 12/1989 | Provence ............................... 375/96 |
| 5,073,940 | 12/1991 | Zinser et al. .......................... 381/47 |
| 5,151,904 | 9/1992 | Reiner et al. .......................... 371/43 |

FOREIGN PATENT DOCUMENTS 2215567 9/1989 United Kingdom .

OTHER PUBLICATIONS

European Conference on Speech Communication and Technology Sep. 1989, Paris pp. 378-381; H. Thompson et al: "A Chart Parsing Realisation of Dynamic Programming, with Best-First Enumeration of paths in a Lattice"—the whole document.

Proceedings of the Global Telecommunications Technology and Exhibition—Globecom 89, Nov. 27-30, 1989, Dallas vol. 3, 1989, New York, IEEE pp. 1680-1686; J. Hagenauer et al.: "A Viterbi Algorithm with Soft-Decision Outputs and its Applications"—Introduction; Paragraph 3.1.2.

IEEE Transactions on Communications. vol. 38, No. 8, Aug. 1990, New York US pp. 1130-1144; E. Paaske: "Improved Decoding for a Concentrated Coding System Recommended by CCSDS"—p. 1140, paragraph IV; figure 4.

Primary Examiner—Robert W. Beausoliel, Jr.
Assistant Examiner—Ly V. Hua
Attorney, Agent, or Firm—Darby & Darby

[57] ABSTRACT

The efficiency of a Viterbi algorithm in a communication system, in which the transmission channel contains memory, is improved when several sequences in a signal string are detected in descending probability order. An error detecting operation then selects the correct sequence, if any, to be the received sequence.

7 Claims, 1 Drawing Sheet

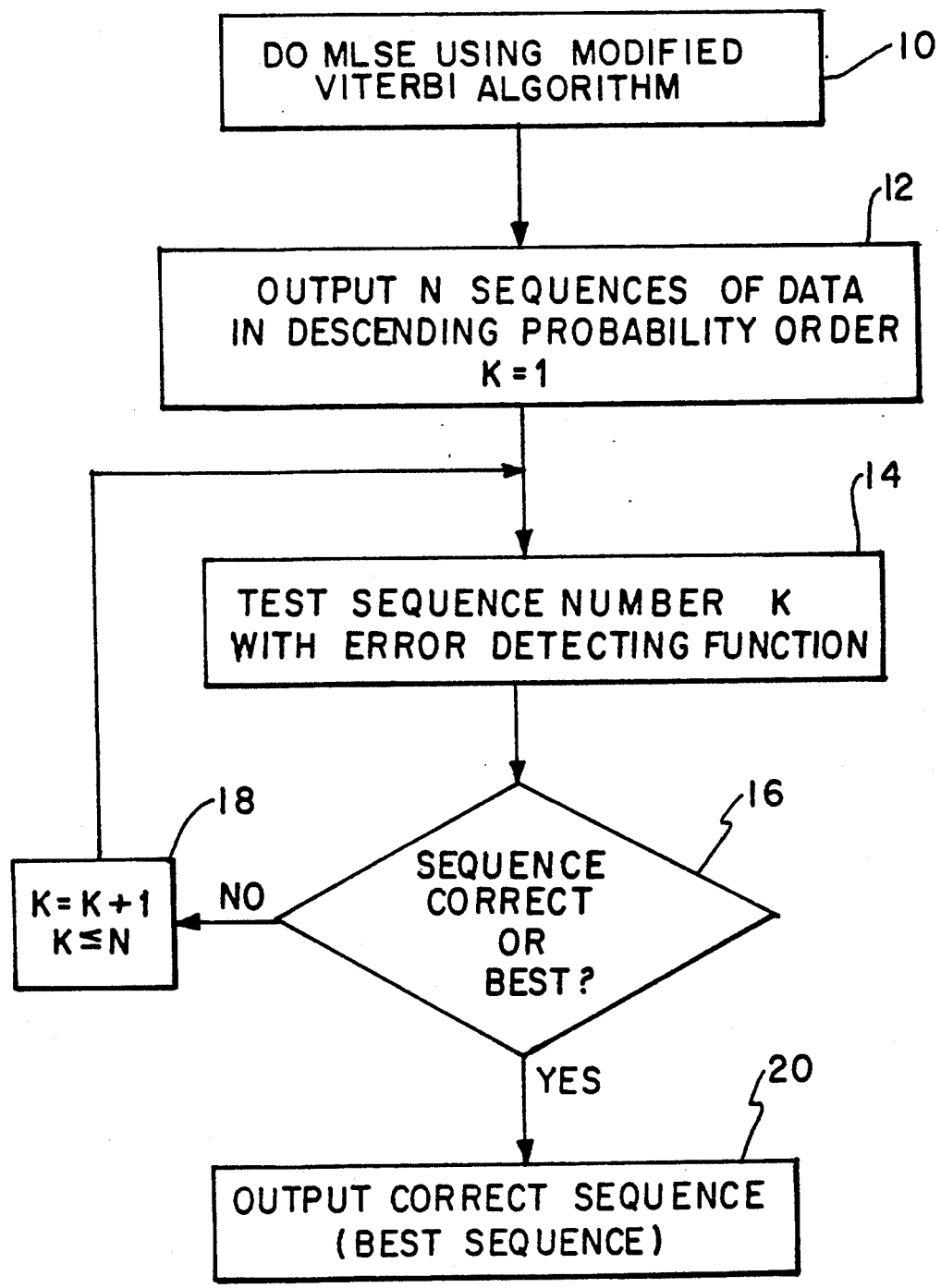

EFFICIENCY OF THE VITERBI ALGORITHM

BACKGROUND OF THE INVENTION

The invention relates to a Maximum Likelihood Sequence Estimation (MLSE) algorithm, and more specifically to a method for improving the efficiency of a Viterbi algorithm in a system receiving a signal string.

Generally, the communication on a memory containing channel becomes more difficult due to unintentional analog convolution coding, which is due to the interaction between symbols. In this context the term "memory containing" means that the values of respective bits in a sequence or in a bit string in a digital transmission system depend on the bits preceding and/or succeeding the respective bit, i.e. on the "memory" of the system. A memory containing channel is intentionally constructed when utilizing convolution codes. The memory of the system is utilized to make the transmission more reliable.

Usually efforts are made to remove unintentional interaction on the transmission path, e.g. with linear or non-linear filtering, the receiver "seeing" a channel almost without memory.

A receiver for data transmission systems containing memory is in a known way based on a MLSE algorithm. With the aid of the MLSE algorithm such a sequence or a bit string is found, which with the greatest probability is the same as the transmitted sequence.

In an ideal MLSE algorithm a signal formed through all possible symbol strings (combinations of symbols or bits) is tested against the signal actually received. Thereby, it is assumed that the response of the channel is known and/or measured. It is possible to select the "best" symbol string with different criteria, which minimize the error probability of the decision.

The use of a MLSE algorithm is in practice limited by the fact that when the length of the symbol string increases, the number of possible combinations to be tested will increase exponentially.

Efforts have been made to solve this problem by taking into account the length of the channel, whereby the calculation requirements are exponentially proportional to the length of the channel instead of to the length of the sequence. The Viterbi algorithm is a well-known algorithm of this kind. As an example of a system where the MLSE-algorithm may be used, the pan-European GSM system may be mentioned, in which it is possible with the Viterbi algorithm to solve the coding for error correction and unintentional coding due to the radio transmission path. With the Viterbi algorithm it is possible to find efficiently the best possible symbol sequence or that sequence, at which the ideal MLSE algorithm also would arrive.

Known methods, that are less complicated than the complete MLSE and the Viterbi algorithm, have a disadvantage of poorer performance than the MLSE.

So called look-up algorithms are also known, with which the Viterbi algorithm can be extended so that it will be able to find the most probable sequence, and in addition a desired number of sequences in descending probability order can be found. As an example of a look-up algorithm of this type there may be mentioned Henry S. Thomson, "Active Chart Parsing/Best First Enumeration of Parts in a Lattice", European Conference on Speech Communication and Technology, Paris, September 1989.

On the other hand, in transmission systems it is known to use error monitoring or error detection to detect, and possibly to correct, an error in a received sequence. Several error detecting functions are known; they are generally of a block type and based on the use of a polynomial. A generic name for these is CRC (Cyclic Redundancy Check)—in colloquial language we talk about parity checks.

SUMMARY OF THE INVENTION

The aim of the invention is to improve the efficiency of known receiving methods, or to increase the efficiency of the Viterbi algorithm in a system, in which the channel contains memory, and in which error detection is used.

This is accomplished in accordance with the invention by combining a Viterbi algorithm with a function, with which the most probable sequence, and in addition several sequences in descending probability order, are found. From these sequences, the best or error-free sequence is selected with the aid of error detection.

The method according to the invention will improve the efficiency of known methods. A similar result could be achieved conceptually by trying out all bit combinations and then testing the result with an error detection function. However, such a procedure would result in calculating requirements increasing exponentially with the length of the MLSE algorithm sequence. On the other hand, the success probability of the error detection function is less than 1, and thus the number of combinations to be tested has to be limited, so that the success probability would not decrease to a value too small (whereby several other sequences along with the correct one could pass the correctness test). These details of the invention are explained below.

BRIEF DESCRIPTION OF THE DRAWING

The sole FIGURE is a flow diagram of the method in accordance with the invention for improving the efficiency of a Viterbi algorithm in a communication system.

DESCRIPTION OF A PREFERRED EMBODIMENT

In a method according to the invention a limit for a sufficient error detection reliability is set by adapting an operating point so that the number of errors for the sequences to be tested can be detected with a high probability (100%).

The method according to the invention utilizes known methods, i.e. (a) the extended Viterbi algorithm and (b) error detection, by combining them in a new way. The prior art Viterbi algorithm, for example, produces an abundance of information such as information on many sequences or bit strings with different probabilities, of which only one piece of information is utilized, that is, the most probable sequence. In accordance with the present invention, the information produced by the Viterbi algorithm on sequences that are not the one "most probable" is not "lost", but it is stored in a memory of the equipment using it. Then, the next best sequences are found from the stored information, and from all of the found sequences the best one is found using error detection (Figure, Boxes 14, 16, 18, 20).

As an advantage this combination of algorithm and error detection will limit calculation requirements; in this method calculation requirements increase linearly when the length of the symbol string increases and not exponentially as in the ideal MLSE algorithm.

The method according to the invention may be applied in general to memory containing systems, which include an error detecting or error monitoring function. The method is not restricted to any specified algorithm or error detection function; some methods have been mentioned above only as illustrative examples.

On the basis of the above description and the inventive concept, it is a simple task for a person skilled in the art to implement the present method, that skilled person being able to use electronic circuits, known per se, for practicing the method.

The invention is preferably applied to digital radio telephone systems and to (mobile) telephone devices and base station equipment in these systems.

In summary, two known techniques are used in a novel manner to provide a better result than either technique when used alone. As illustrated in the FIGURE, an error free (correct or "best") sequence is identified by performing a known MLSE estimation on an incoming transmission to determine the "most probable" sequence (Figure, Box 10), and additionally the next most probable, etc. so as to rate and place N sequences in an order of descending probability (Box 12). This can be accomplished with known circuits which therefore are not described herein in further detail.

Then known error detection is applied (Box 14) to each sequence, which was found through MLSE, in order, until the correct or best sequence is identified (Box 16) and output (Box 20).

This error detection sequence is also implemented using known circuitry, which accordingly requires no further description herein.

The invention resides in the combined use of two known, prior art functions.

We claim:

1. A method for improving efficiency of a Viterbi algorithm in a system receiving a signal string via a transmission channel having memory of at least part of a previous signal, comprising the steps of:
    detecting, by using the Viterbi algorithm, a most probable sequence in said signal string;
    detecting, by using an extension of the Viterbi algorithm, several additional sequences in said received signal string in descending probability order;
    performing an error detection operation on all of said detected sequences until one of an error-free sequence and the sequence with the least number of errors is detected by the error detection operation as the best sequence; and
    selecting the best sequence as a received sequence.

2. Method according to claim 1, wherein the sequences detected by said extended algorithm are stored in a memory device, from which memory device the stored sequences are read out to be processed in the error detection operation.

3. The method of claim 2, wherein said system is a data communication system.

4. Method according to claim 1, wherein error detection is immediately performed on a sequence detected by said extended algorithm and error detection is repeated on said sequences in descending probability order until an error-free sequence is found.

5. The method of claim 4, wherein said system is a data communication system.

6. The method of claim 1, wherein said system is a data communication system.

7. The method of claim 6, wherein said communication system is a pan-European digital mobile telephone system.

* * * * *

UNITED STATES PATENT AND TRADEMARK OFFICE
CERTIFICATE OF CORRECTION

PATENT NO.   :   5,327,439
DATED        :   July 5, 1994
INVENTOR(S)  :   Kari P. Estola et al.

It is certified that error appears in the above-indentified patent and that said Letters Patent is hereby corrected as shown below:

On the cover page of the patent, at paragraph

[75] Inventor:, please change

"Kari P. Estola, Tampere; Harri A. Jokinen, Pertteli, both of Finland" to -- Kari P. Estola, Tampere, Harri A. Jokinen, Pertteli; Erkii J. Kuisma, Halikko, all of Finland --

Signed and Sealed this

Eleventh Day of April, 1995

Attest:

BRUCE LEHMAN

*Attesting Officer*       *Commissioner of Patents and Trademarks*